United States Patent
Hagihara et al.

(10) Patent No.: US 12,176,237 B2
(45) Date of Patent: Dec. 24, 2024

(54) ELECTROSTATIC CHUCK DEVICE

(71) Applicant: Tomoegawa Co., Ltd., Tokyo (JP)

(72) Inventors: Tomoya Hagihara, Shizuoka (JP); Jun Tochihira, Yaizu (JP)

(73) Assignee: TOMOEGAWA CORPORATION, Tokyo (JP)

( * ) Notice: Subject to any disclaimer, the term of this patent is extended or adjusted under 35 U.S.C. 154(b) by 129 days.

(21) Appl. No.: 17/799,956

(22) PCT Filed: Feb. 10, 2021

(86) PCT No.: PCT/JP2021/005074
§ 371 (c)(1),
(2) Date: Aug. 16, 2022

(87) PCT Pub. No.: WO2021/166774
PCT Pub. Date: Aug. 26, 2021

(65) Prior Publication Data
US 2023/0100462 A1 Mar. 30, 2023

(30) Foreign Application Priority Data
Feb. 21, 2020 (JP) .................................. 2020-028081

(51) Int. Cl.
*H01L 21/683* (2006.01)

(52) U.S. Cl.
CPC ................................ *H01L 21/6833* (2013.01)

(58) Field of Classification Search
CPC ............. H01L 21/6833; H01L 21/6831; H01L 21/68757

(Continued)

(56) References Cited

U.S. PATENT DOCUMENTS

| 6,256,187 B1 * | 7/2001 | Matsunaga ............... C08L 9/02 429/208 |
| 2002/0058131 A1 * | 5/2002 | Nishide ..................... C03C 8/02 428/323 |

(Continued)

FOREIGN PATENT DOCUMENTS

| JP | 2002299425 A | 10/2002 |
| JP | 2006344955 A | 12/2006 |

(Continued)

OTHER PUBLICATIONS

Office Action mailed Jan. 9, 2024 in JP Application 2020-028081 (English translation).

(Continued)

*Primary Examiner* — Dharti H Patel
(74) *Attorney, Agent, or Firm* — Panitch Schwarze Belisario & Nadel LLP (57) ABSTRACT

An electrostatic chuck device is provided in which the occurrence of cracking in a ceramic layer, the cracking being caused by a difference in thermal expansion between a substrate and a sleeve due to heat generated during formation of the ceramic layer, is suppressed. The electrostatic chuck device includes a substrate, a laminated body that is laminated on the substrate and that includes at least an internal electrode, and a ceramic layer that is laminated on the upper surface of the laminated body in the thickness direction. The electrostatic chuck device is such that the substrate has a through-hole provided so as to pass through in the thickness direction, a sleeve formed from an insulating material is inserted into the through-hole, and the sleeve is joined to the through-hole via a joining means at an upper portion of the substrate in the thickness direction.

4 Claims, 7 Drawing Sheets

(58) Field of Classification Search
USPC .......................................................... 361/234
See application file for complete search history.

(56) References Cited

U.S. PATENT DOCUMENTS

| | | | |
|---|---|---|---|
| 2006/0175772 A1 | 8/2006 | Nozawa | |
| 2006/0279899 A1 | 12/2006 | Aihara et al. | |
| 2009/0243235 A1* | 10/2009 | Nobori | H02N 13/00 279/128 |
| 2014/0204501 A1* | 7/2014 | Moriya | H01L 21/6833 361/234 |
| 2014/0355170 A1* | 12/2014 | Wada | H01L 21/6831 361/234 |
| 2016/0240422 A1 | 8/2016 | Takahashi et al. | |
| 2020/0090959 A1* | 3/2020 | Takebayashi | H05B 3/74 |
| 2021/0074570 A1* | 3/2021 | Kugimoto | H01L 21/3065 |

FOREIGN PATENT DOCUMENTS

| | | |
|---|---|---|
| JP | 2013131541 A | 7/2013 |
| JP | 2015079785 A | 4/2015 |
| JP | 2016028448 A | 2/2016 |
| TW | 200625501 A | 7/2006 |
| TW | 200735254 A | 9/2007 |
| WO | 2004084298 A1 | 9/2004 |
| WO | 2017126534 A1 | 7/2017 |

OTHER PUBLICATIONS

Office Action mailed Dec. 12, 2023 in TW Application No. 110105467.
Int'l Search Report issued Mar. 23, 2021 in Int'l Application No. PCT/JP2021/005074.
Office Action issued on Sep. 26, 2024, in TW Application No. 113108826.

* cited by examiner

Prior Art

ELECTROSTATIC CHUCK DEVICE

CROSS-REFERENCE TO RELATED APPLICATIONS

This application is a Section 371 of International Application No. PCT/JP2021/005074, filed Feb. 10, 2021, which was published in the Japanese language on Aug. 26, 2021, under International Publication No. WO 2021/166774 A1, which claims priority under 35 U.S.C. § 119 (b) to Japanese Application No. 2020-028081, filed Feb. 21, 2020, the disclosure of each of which is incorporated herein by reference in its entirety.

TECHNICAL FIELD

The present invention relates to an electrostatic chuck device.

BACKGROUND ART

When manufacturing a semiconductor integrated circuit using a semiconductor wafer, or when manufacturing a liquid crystal panel using an insulating substrate such as a glass substrate or a film, it is necessary to adsorb and hold a base material such as a semiconductor wafer, a glass substrate, or an insulating substrate at a predetermined portion. Therefore, in order to adsorb and hold those base materials, a mechanical chuck, a vacuum chuck, or the like by a mechanical method has been used. However, these holding methods have problems such as difficulty in uniformly holding the substrate (adsorbed body), inability to use in a vacuum, and an excessive rise in the temperature of the sample surface. Therefore, in recent years, an electrostatic chuck device capable of solving these problems has been used for holding the adsorbed body.

As main parts the electrostatic chuck device is provided with a conductive support member that serves as an internal electrode and a dielectric layer made of a dielectric material that covers the conductive support member. The adsorbed body can be adsorbed by these main parts. When a voltage is applied to the internal electrode in the electrostatic chuck device to generate a potential difference between the adsorbed body and the conductive support member, an electrostatic adsorption force is generated with the dielectric layer. Thereby, the adsorbed body is supported in an almost flat manner with respect to the conductive support member.

Figure 7:
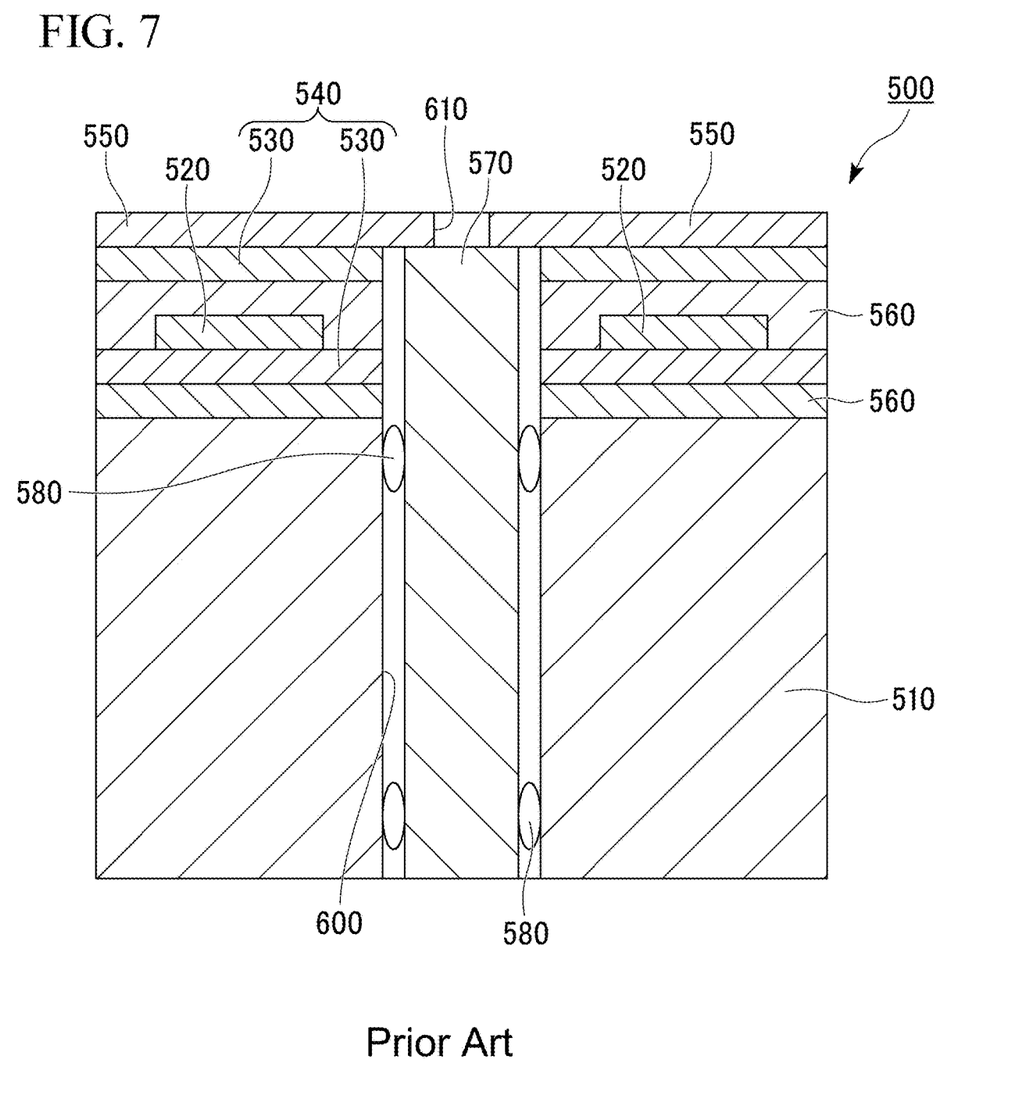
FIG. 7 shows a schematic configuration of a conventional electrostatic chuck device, being a cross-sectional view taken along the height direction of the electrostatic chuck device.

As a conventional electrostatic chuck device, there is known an electrostatic chuck device in which an insulating organic film is laminated on an internal electrode to form a dielectric layer. Such an electrostatic chuck device is provided with a gas supply hole for cooling the ceramic layer with gas (see, for example, Patent Documents 1 and 2). An example of such an electrostatic chuck device is shown in FIG. 7. The electrostatic chuck device 500 shown in FIG. 7 is provided with at least a substrate 510, a laminated body 540 including at least a plurality of internal electrodes 520 and an insulating organic film 530 provided on both sides the internal electrodes 520 in the thickness direction, that are laminated on the substrate 510, and a ceramic layer 550 laminated on the upper surface of the laminated body 540 in the thickness direction. The internal electrodes 520 and the insulating organic film 530 are laminated on the substrate 510 via an adhesive layer 560. Further, a gas supply hole 600 for cooling the ceramic layer 550 with gas is provided so as to penetrate the substrate 510 and the laminated body 540 in the thickness direction. A sleeve 570 made of an insulating material is inserted into the gas supply hole 600. The sleeve 570 is joined to the inner surface of the gas supply hole 600 via an adhesive 580 at the upper and lower portions of the substrate 510 in the thickness direction. Further, the ceramic layer 550 is provided with a through-hole 610 penetrating in the thickness direction thereof. The inner diameter of the through-hole 610 (the diameter perpendicular to the thickness direction) is smaller than the inner diameter of the gas supply hole 600 (diameter perpendicular to the thickness direction).

PRIOR ART DOCUMENTS

Patent Documents

[Patent Document 1] Japanese Unexamined Patent Application Publication No. 2002-299425
[Patent Document 2] PCT International Publication No. 2004/084298

DISCLOSURE OF THE INVENTION

Problems to be Solved by the Invention

The substrate 510 is made of a material having a relatively large coefficient of linear expansion such as aluminum, and the sleeve 570 is made of a material having a relatively small coefficient of linear expansion such as alumina. When the ceramic layer 550 is formed on the laminated body 540, a method of spraying the material constituting the ceramic layer 550 onto the entire outer surface of the laminated body 540 is used. The heat generated by the thermal spraying is transferred to the substrate 510 and the sleeve 570. Then, the heat causes the substrate 510 to stretch, but the sleeve 570 does not. When the sleeve 570 is joined to the gas supply hole 600 at the upper part and the lower part in the thickness direction of the substrate 510, cracking may occur in the ceramic layer 550 (particularly the ceramic layer 550 on the substrate 510 side) due to the thermal expansion of the substrate 510.

The present invention has been made in view of the above circumstances, and has as its object to provide an electrostatic chuck device in which the occurrence of cracking in a ceramic layer is suppressed, said cracking being caused by a difference in thermal expansion between a substrate and a sleeve due to heat generated during formation of the ceramic layer.

Means for Solving the Problems

The present invention has the following aspects.

[1] An electrostatic chuck device provided with a substrate, a laminated body that is laminated on the substrate and that includes at least an internal electrode, and a ceramic layer that is laminated on the upper surface of the laminated body in the thickness direction, characterized by the substrate having a through-hole provided so as to pass through in the thickness direction, a sleeve formed from an insulating material being inserted into the through-hole, and the sleeve being joined to the through-hole via a joining means at an upper portion of the substrate in the thickness direction.

[2] The electrostatic chuck device according to [1], in which the ceramic layer has a base layer and a surface layer formed on the upper surface of the base layer and having irregularities.

[3] The electrostatic chuck device according to [1] or [2], in which the laminated body includes at least an insulating organic film provided on both sides of the internal electrode in the thickness direction.

Effects of the Invention

According to the present invention, it is possible to provide an electrostatic chuck device that suppresses the occurrence of cracking in a ceramic layer, said cracking being caused by a difference in thermal expansion between a substrate and a sleeve due to heat generated during formation of the ceramic layer.

EMBODIMENTS FOR CARRYING OUT THE INVENTION

Hereinbelow, the electrostatic chuck device of the embodiment to which the present invention is applied will be described. In the drawings used in the following description, the dimensional ratios and the like of each component are not always the same as the actual ones.

It should be noted that the present embodiment is one that is specifically described in order to better understand the gist of the invention, and does not limit the present invention unless otherwise specified.

[Electrostatic Chuck Device]

First Embodiment

Figure 1:
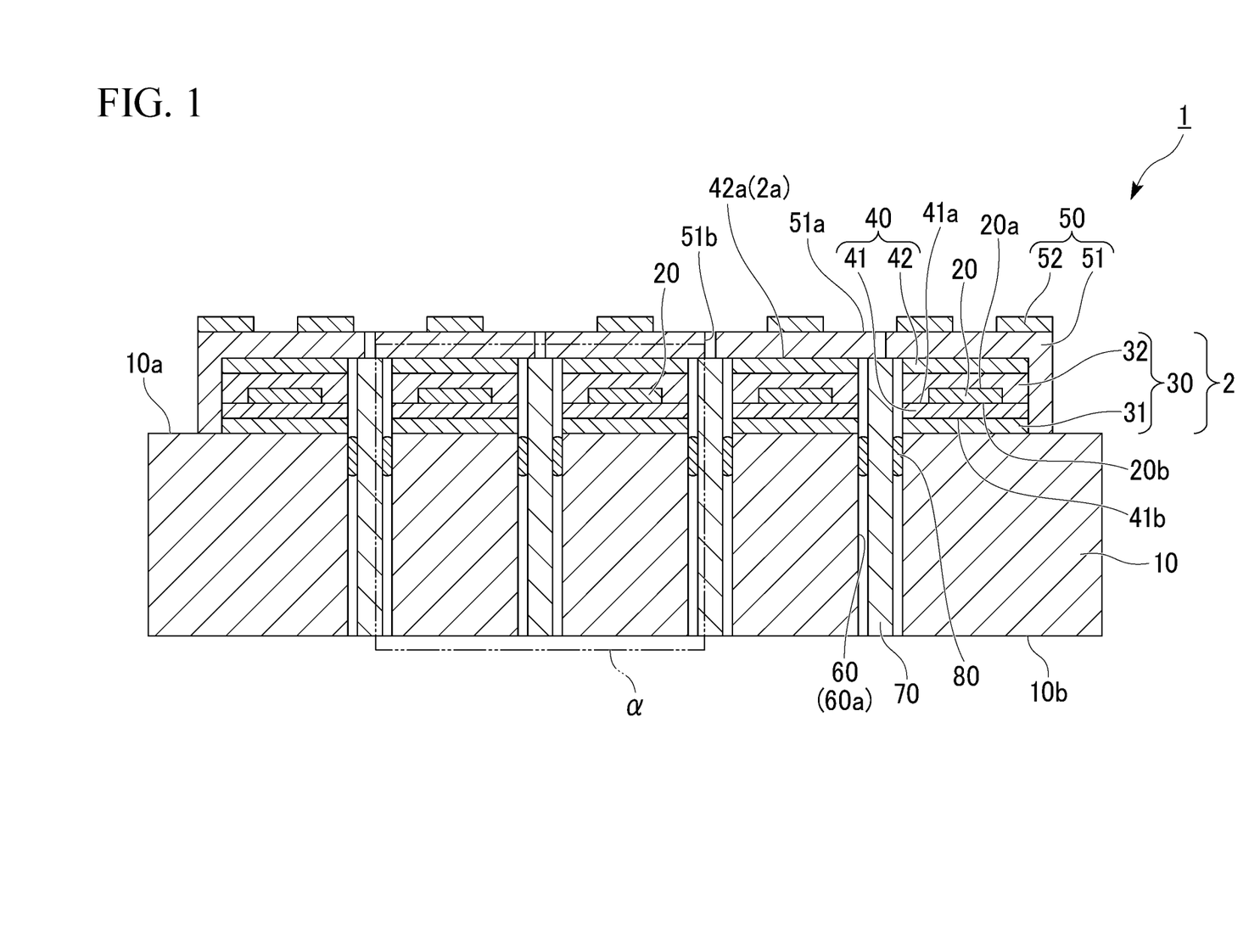
FIG. 1 shows a schematic configuration of an electrostatic chuck device according to the present invention, being a cross-sectional view taken along the height direction of the electrostatic chuck device.
Figure 2:
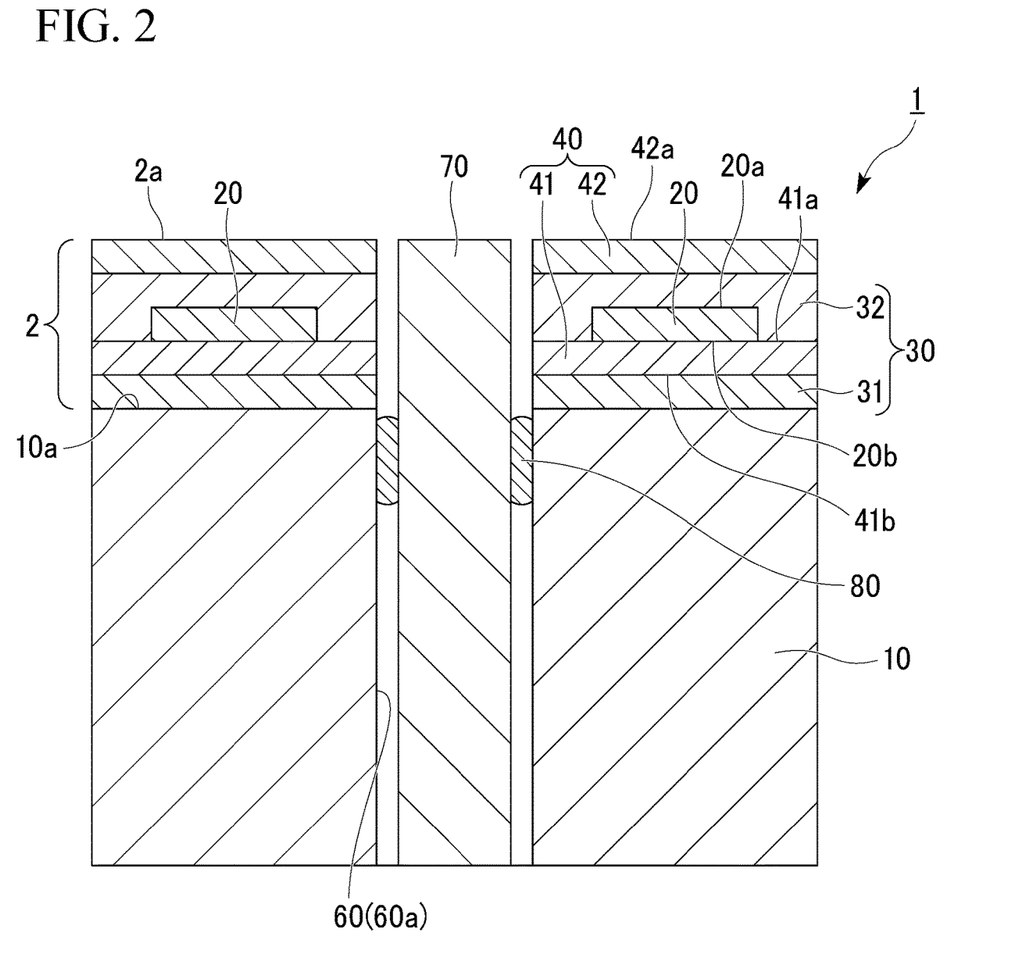
FIG. 2 shows a first embodiment of the schematic configuration of an electrostatic chuck device according to the present invention, being an enlarged view of a region α shown in FIG. 1.

FIG. 1 shows a schematic configuration of the electrostatic chuck device of the present embodiment, being is a cross-sectional view taken along the height direction of the electrostatic chuck device. FIG. 2 shows a first embodiment of the schematic configuration of the electrostatic chuck device according to the present invention, being an enlarged view of the region α shown in FIG. 1.

As shown in FIG. 1, the electrostatic chuck device 1 of the present embodiment is provided with a substrate 10, a laminated body 2 including at least a plurality of internal electrodes 20, and a ceramic layer that is laminated on the upper surface 2a of the laminated body 2 in the thickness direction.

In the electrostatic chuck device 1 of the present embodiment, the laminated body 2 may include an adhesive layer 30 and an insulating organic film 40 in addition to the internal electrodes 20. The adhesive layer 30 is composed of a first adhesive layer 31 and a second adhesive layer 32. The insulating organic film 40 is composed of a first insulating organic film 41 and a second insulating organic film 42.

In the electrostatic chuck device 1 of the present embodiment, the first adhesive layer 31, the first insulating organic film 41, the internal electrode 20, the second adhesive layer 32, the second insulating organic film 42, and the ceramic layer 50 are laminated in this order on the surface 10a of the substrate 10 (upper surface of the substrate in the thickness direction).

In the electrostatic chuck device 1 of the present embodiment, as shown in FIG. 1, the laminated body 2 may include at least the insulating organic film 40 provided on both sides of the internal electrode 20 in the thickness direction (upper surface 20a in the thickness direction of the internal electrode 20 and lower surface 20b in the thickness direction of the internal electrode 20), respectively. Specifically, the second insulating organic film 42 may be provided on the upper surface 20a side in the thickness direction of the internal electrode 20, and the first insulating organic film 41 may be provided on the lower surface 20b side in the thickness direction of the internal electrode 20.

The first adhesive layer 31 is provided on the surface of the first insulating organic film 41 opposite to the internal electrode 20 (lower surface 41b of the first insulating organic film 41). The second adhesive layer 32 is provided between the first insulating organic film 41 and the internal electrode 20 provided on the upper surface 41a of the first insulating organic film 41 in the thickness direction, and the second insulating organic film 42.

In the electrostatic chuck device 1 of the present embodiment, the substrate 10 has a through-hole 60 provided so as to penetrate in the thickness direction. Specifically, as shown in FIG. 1, the through-hole 60 is provided so as to penetrate the substrate 10 and the laminated body 2 in the thickness direction. A sleeve 70 made of an insulating material is inserted into the through-hole 60. The sleeve 70 is joined to an inner side surface 60a of the through-hole 60 via a joining means 80 only at the upper portion of the substrate 10 in the thickness direction. Further, the through-hole 60 is a hole for cooling the ceramic layer 50 with gas, and for inserting a lift pin for lifting up the adsorbed body adhered to the electrostatic chuck device 1, or an HV pin (DC voltage pin) for applying a voltage to the internal electrode 20.

As shown in FIG. 1, the ceramic layer 50 preferably has a ceramic base layer 51 and a ceramic surface layer 52 formed on an upper surface 51a of the ceramic base layer 51 (upper surface in the thickness direction of the ceramic base layer 51) and having irregularities. Further, the ceramic base layer 51 is provided with a through-hole 51b penetrating in the thickness direction thereof. The inner diameter of the through-hole 51b (diameter perpendicular to the thickness direction) is smaller than the inner diameter of the through-hole 60 (diameter perpendicular to the thickness direction).

The internal electrode 20 may be in contact with the first insulating organic film 41 or the second insulating organic film 42. Further, as shown in FIG. 1, the internal electrode 20 may be formed inside the second adhesive layer 32. The arrangement of the internal electrode 20 can be appropriately designed.

As shown in FIG. 1, when the plurality of internal electrodes 20 are independent of each other, not only voltages having the same polarity but also voltages having different polarities can be applied. Each internal electrode 20 is not particularly limited in its electrode pattern and shape as long as it can adsorb an adsorbed body such as a conductor, a semiconductor, and an insulator. Further, the internal electrodes 20 do not have to be independent.

The electrostatic chuck device 1 of the present embodiment is not particularly limited in other layer configurations provided the ceramic layer 50 is laminated on the upper surface 2a of the laminated body 2 including at least the internal electrodes 20 laminated on the substrate 10.

The substrate 10 is not particularly limited, and examples thereof include a ceramic substrate, a silicon carbide substrate, and a metal substrate made of aluminum, stainless steel, or the like.

The internal electrode 20 is not particularly limited as long as it is made of a conductive substance capable of exhibiting electrostatic adsorption force when a voltage is applied. As the internal electrode 20, for example, a thin film made of a metal such as copper, aluminum, gold, silver, platinum, chromium, nickel, and tungsten, and a thin film made of at least two kinds of metals selected from the above metals are preferably used. Examples of such a metal thin film include those formed by vapor deposition, plating, sputtering, and the like, those formed by applying and drying a conductive paste, and specifically, metal foils such as copper foil.

The thickness of the internal electrode 20 is not particularly limited as long as the thickness of the second adhesive layer 32 is larger than the thickness of the internal electrode 20. The thickness of the internal electrode 20 is preferably 20 μm or less. When the thickness of the internal electrode 20 is 20 μm or less, irregularities are unlikely to occur on the upper surface 42a of the second insulating organic film 42 when forming the second insulating organic film 42. As a result, defects are less likely to occur when the ceramic layer 50 is formed on the second insulating organic film 42 or when the ceramic layer 50 is polished.

The thickness of the internal electrode 20 is preferably 1 μm or more. When the thickness of the internal electrode 20 is 1 μm or more, sufficient bonding strength can be obtained when the internal electrode 20 is bonded to the first insulating organic film 41 or the second insulating organic film 42.

When a voltage having a different polarity is applied to each of the plurality of internal electrodes 20, the interval between the adjacent internal electrodes 20 (the interval in the direction perpendicular to the thickness direction of the internal electrodes 20) is preferably 2 mm or less. When the interval between the adjacent internal electrodes 20 is 2 mm or less, a sufficient electrostatic force is generated between the adjacent internal electrodes 20, and a sufficient adsorption force is generated.

The distance from the internal electrode 20 to the adsorbed body, that is, the distance from the upper surface 20a of the internal electrode 20 to the adsorbed body that is adsorbed on the ceramic surface layer 52 (the total thickness of the second adhesive layer 32, the second insulating organic film 42, the ceramic base layer 51, and the ceramic surface layer 52, existing on the upper surface 20a of the internal electrode 20) is preferably 50 μm to 125 μm. When the distance from the internal electrode 20 to the adsorbed body is 50 μm or more, it is possible to secure the insulating property of the laminated body composed of the second adhesive layer 32, the second insulating organic film 42, the ceramic base layer 51, and the ceramic surface layer 52. On the other hand, if the distance from the internal electrode 20 to the adsorbed body is 125 μm or less, sufficient adsorption force is generated.

As the adhesive constituting the adhesive layer 30, an adhesive is used containing one or more types of resin as the main component selected from an epoxy resin, a phenol resin, a styrene block copolymer, a polyamide resin, an acrylonitrile-butadiene copolymer, a polyester resin, a polyimide resin, a silicone resin, an amine compound, and a bismaleimide compound.

Examples of an epoxy resin include bifunctional or polyfunctional epoxy resins such as bisphenol type epoxy resin, phenol novolac type epoxy resin, cresol novolac type epoxy resin, glycidyl ether type epoxy resin, glycidyl ester type epoxy resin, glycidylamine type epoxy resin, trihydroxyphenylmethane type epoxy resin, tetraglycidylphenol alkane type epoxy resin, naphthalene type epoxy resin, diglycidyl diphenylmethane type epoxy resin, diglycidyl biphenyl type epoxy resin, and the like. Among these, bisphenol type epoxy resins are preferable. Among bisphenol type epoxy resins, the bisphenol A type epoxy resin is particularly preferable. When the main component is an epoxy resin, if necessary, a curing agent or curing accelerator for epoxy resins such as imidazoles, tertiary amines, phenols, dicyandiamides, aromatic diamines, and organic peroxides can also be added.

Examples of a phenol resin include a novolak phenol resin such as alkylphenol resin, p-phenylphenol resin and bisphenol A type phenol resin, resolphenol resin, polyphenylparaphenol resin and the like.

Examples of a styrene-based block copolymer include a styrene-butadiene-styrene block copolymer (SBS), a styrene-isoprene-styrene block copolymer (SIS), and a styrene-ethylene-propylene-styrene copolymer (SEPS).

The thickness of the adhesive layer 30 (first adhesive layer 31 and second adhesive layer 32) is not particularly limited, but is preferably 5 μm to 20 μm, and more preferably 10 μm to 20 μm. When the thickness of the adhesive layer 30 (first adhesive layer 31 and second adhesive layer 32) is 5 μm or more, it sufficiently functions as an adhesive. On the other hand, if the thickness of the adhesive layer 30 (first adhesive layer 31 and second adhesive layer 32) is 20 μm or less, the insulation between the electrodes of the internal electrodes 20 can be ensured without impairing the adsorption force.

The material constituting the insulating organic film 40 is not particularly limited, and for example, polyesters such as polyethylene terephthalate, polyolefins such as polyethylene, polyimide, polyamide, polyamideimide, polyether sulfone, polyphenylene sulfide, polyether ketone, polyetherimide, triacetylcellulose, silicone rubber, polytetrafluoroethylene and the like are used. Among these, polyesters, polyolefins, polyimides, silicone rubbers, polyetherimides, polyethersulfons, and polytetrafluoroethylene are preferable, and polyimides are more preferable because of their excellent insulating properties. As a polyimide film, for example, Kapton (trade name) manufactured by Toray DuPont, UPILEX (trade name) manufactured by Ube Kosan Co. or the like is used.

The thickness of the insulating organic film 40 (the first insulating organic film 41 and second insulating organic film 42) is not particularly limited, but is preferably 10 μm to 100 μm, and more preferably 10 μm to 50 μm. When the thickness of the insulating organic film 40 (the first insulating organic film 41 and the second insulating organic film 42) is 10 μm or more, the insulating property can be ensured. On the other hand, if the thickness of the insulating organic film 40 (the first insulating organic film 41 and second insulating organic film 42) is 100 μm or less, sufficient adsorption force is generated.

Further, instead of the insulating organic film 40 (the first insulating organic film 41 and second insulating organic film 42), a ceramic plate made of a ceramic material may be used.

The through-hole 60 penetrates the substrate 10 and the laminated body 2 in the thickness direction, but the shape in a plan view (the shape seen from the upper surface 51a side of the ceramic base layer 51) is not particularly limited. Examples of the plan view shape of the through-hole 60 include a circular shape and a rectangular shape. The inner diameter of the through-hole 60 is not particularly limited, but is preferably, for example, 5 mm to 15 mm, and more preferably 5 mm to 13 mm. The inner diameter of the through-hole 60 is the diameter of the through-hole 60 when the shape of the through-hole 60 in a plan view is circular, and is the length of the largest portion of the through-hole 60 when the shape of the through-hole 60 in a plan view is other than a circular shape.

Examples of the insulating material constituting the sleeve 70 include aluminum oxide (alumina), yttria, zirconia and the like.

While the sleeve 70 is a columnar member, the cross-sectional shape perpendicular to the longitudinal direction is not particularly limited, and is appropriately set according to the plan-view shape of the through-hole 60. The outer diameter of the sleeve 70 is not particularly limited, but is preferably 4.9 mm to 14.9 mm, and more preferably 4.9 mm to 13 mm, for example. The outer diameter of the sleeve 70 is the diameter of the cross section perpendicular to the longitudinal direction of the sleeve 70 when the cross-sectional shape perpendicular to the longitudinal direction of the sleeve 70 is circular, and is the length of the largest portion of the cross section perpendicular to the longitudinal direction of the sleeve 70 when the cross-sectional shape perpendicular to the longitudinal direction of the sleeve 70 is other than a circular shape.

The sleeve 70 is a columnar member having a hollow inside, with the inner diameter of the sleeve 70 not being particularly limited, but being preferably 0.5 mm to 5 mm, and more preferably 0.3 mm to 3 mm, for example.

The distance between the inner side surface 60a of the through-hole 60 and the sleeve 70 (the gap between the inner side surface 60a of the through-hole 60 and the sleeve 70) is not particularly limited, but is preferably, for example, 50 μm to 200 μm, and more preferably 50 μm to 100 μm.

In the electrostatic chuck device 1 of the present embodiment, an adhesive is used as the joining means 80.

The adhesive is not particularly limited, and examples thereof include epoxy resin, polyimide resin, acrylic resin, silane resin, and silicone resin.

The length of the joining means 80 made of an adhesive is not particularly limited as long as the sleeve 70 can be fixed to the inner side surface 60a of the through-hole 60 via the adhesive, but is, for example, 5% to 30% of the thickness of the substrate 10, and more preferably 5% to 10%.

The mounting position of the joining means 80 is preferably provided within 50% of the thickness of the substrate 10 from the surface 10a, more preferably within 30% of the thickness of the substrate 10 from the surface 10a, and particularly preferably within 10% of the thickness of the substrate 10 from the surface 10a, heading from the surface 10a of the substrate 10 (upper surface of the substrate 10 in the thickness direction) toward the bottom surface 10b of the substrate 10 (bottom surface of the substrate 10 in the thickness direction). The preferred mounting position for the joining means in the second embodiment, the third embodiment, the fourth embodiment and the fifth embodiment described below is the same as that of the joining means 80.

The material constituting the ceramic layer 50 is not particularly limited, and for example, boron nitride, aluminum nitride, zirconium oxide, silicon oxide, tin oxide, indium oxide, quartz glass, soda glass, lead glass, borosilicate glass, zirconium nitride, titanium oxide and the like are used. These materials may be used alone or used in admixture of two or more.

These materials are preferably powders having an average particle size of 1 μm to 25 μm. Using such a powder, the voids in the ceramic layer 50 can be reduced and the withstand voltage of the ceramic layer 50 can be improved.

The thickness of the ceramic base layer 51 is preferably 10 μm to 80 μm, and more preferably 40 μm to 60 μm. When the thickness of the ceramic base layer 51 is 10 μm or more, sufficient plasma resistance and withstand voltage resistance are exhibited. On the other hand, if the thickness of the ceramic base layer 51 is 80 μm or less, sufficient adsorption force is generated.

The thickness of the ceramic surface layer 52 is preferably 5 μm to 20 μm. When the thickness of the ceramic surface layer 52 is 5 μm or more, irregularities can be formed over the entire area of the ceramic surface layer 52. On the other hand, if the thickness of the ceramic surface layer 52 is 20 μm or less, sufficient adsorption force is generated.

The adsorptive power of the ceramic surface layer 52 can be improved by polishing the surface thereof, and irregularities of the surface can be adjusted as the surface roughness Ra.

Here, the surface roughness Ra means a value measured by the method specified in JIS B0601-1994.

The surface roughness Ra of the ceramic surface layer 52 is preferably 0.05 μm to 0.5 μm. When the surface roughness Ra of the ceramic surface layer 52 is within the above range, the adsorbed body can be satisfactorily adsorbed. When the surface roughness Ra of the ceramic surface layer 52 becomes large, the contact area between the adsorbed body and the ceramic surface layer 52 becomes small, so that the adsorption force also becomes small.

In the electrostatic chuck device 1 of the present embodiment, the ceramic layer 50 may be laminated via an intermediate layer not shown on the upper surface 2a in the thickness direction of the laminated body 2 including at least the internal electrode 20 and the insulating organic film 40 (the upper surface 42a of the second insulating organic film 42).

The intermediate layer preferably contains at least one of an organic insulating resin and an inorganic insulating resin, and at least one of an inorganic filler and a fibrous filler.

The organic insulating resin is not particularly limited, and examples thereof include a polyimide resin, an epoxy resin, and an acrylic resin.

The inorganic insulating resin is not particularly limited, and examples thereof include a silane-based resin and a silicone-based resin.

It is preferable that the intermediate layer contains polysilazane. Examples of polysilazane include those known in the art. The polysilazane may be an organic polysilazane or an inorganic polysilazane. These materials may be used alone or in admixture of two or more.

The content of the inorganic filler in the intermediate layer is preferably 100 parts by mass to 300 parts by mass, and more preferably 150 parts by mass to 250 parts by mass with respect to 100 parts by mass of polysilazane. When the content of the inorganic filler in the intermediate layer is within the above range, since the inorganic filler particles can form irregularities on the surface of the resin film which is the cured product of the intermediate layer, the powder of the thermal spray material easily bites between the inorganic filler particles, and the thermal spray material can be firmly adhered to the surface of the resin film.

The inorganic filler is not particularly limited, but is preferably at least one selected from the group consisting of alumina, silica and ytria.

The inorganic filler is preferably at least one of spherical powder and amorphous powder. The spherical powder is a sphere with rounded corners of the powder particles. The amorphous powder is one that does not have a constant shape, such as a crushed shape, a plate shape, a scale shape, a needle shape, or the like.

The average particle size of the inorganic filler is preferably 1 µm to 20 µm. When the inorganic filler is a spherical powder, its diameter (outer diameter) is defined as the particle diameter, and when the inorganic filler is an amorphous powder, the longest portion of the shape is defined as the particle diameter.

The fibrous filler is preferably at least one selected from the group consisting of plant fibers, inorganic fibers and fibrous organic resins.

Examples of plant fibers include pulp and the like.

Examples of inorganic fibers include a fiber made of alumina and the like.

Examples of fibrous organic resins include fibers made of aramid, Teflon (registered trademark), and the like.

The inorganic filler is preferably used in combination with the fibrous filler, and the total content of the inorganic filler and the fibrous filler with respect to the entire intermediate layer (100% by volume) is preferably 10% by volume to 80% by volume. When the total content of the inorganic filler and the fibrous filler in the intermediate layer is within the above range, the ceramic layer can be uniformly formed on the intermediate layer by thermal spraying.

The thickness of the intermediate layer is preferably 1 µm to 40 µm, and more preferably 5 µm to 20 µm. When the thickness of the intermediate layer is 1 µm or more, the intermediate layer does not become thin locally, and so the ceramic layer 50 can be uniformly formed on the intermediate layer by thermal spraying. On the other hand, if the thickness of the intermediate layer is 40 µm or less, sufficient adsorption force is generated.

In the electrostatic chuck device 1 of the present embodiment described above, the substrate 10 has a through-hole 60 provided so as to penetrate in the thickness direction, and the sleeve 70 inserted into the through-hole 60 is joined to the through-hole 60 via the joining means 80 only at the upper portion of the substrate 10 in the thickness direction. Accordingly, when the heat generated when forming the ceramic layer 50 is transferred to the electrostatic chuck device 1, the substrate 10 can extend to the lower side in the thickness direction thereof. For that reason, it is possible to suppress the occurrence of cracking in the ceramic layer 50 (particularly the ceramic base layer 51) due to the thermal expansion of the substrate 10. That is, it is possible to suppress the occurrence of cracking in the ceramic layer 50 (particularly the ceramic base layer 51) caused by a difference in thermal expansion between the substrate 10 and the sleeve 70. In particular, when the substrate 10 is made of aluminum and the sleeve 70 is made of ceramics, it is possible to suppress the occurrence of cracking in the ceramic layer 50 (particularly the ceramic base layer 51).

In the electrostatic chuck device 1 of the present embodiment, the ceramic layer 50 has the ceramic base layer 51 and the ceramic surface layer 52 formed on the upper surface 51a of the ceramic base layer 51 and having irregularities, whereby the desired adsorption force can be controlled.

In the electrostatic chuck device 1 of the present embodiment, the withstand voltage is improved because the insulating organic film is a polyimide film.

Second Embodiment

Figure 3:
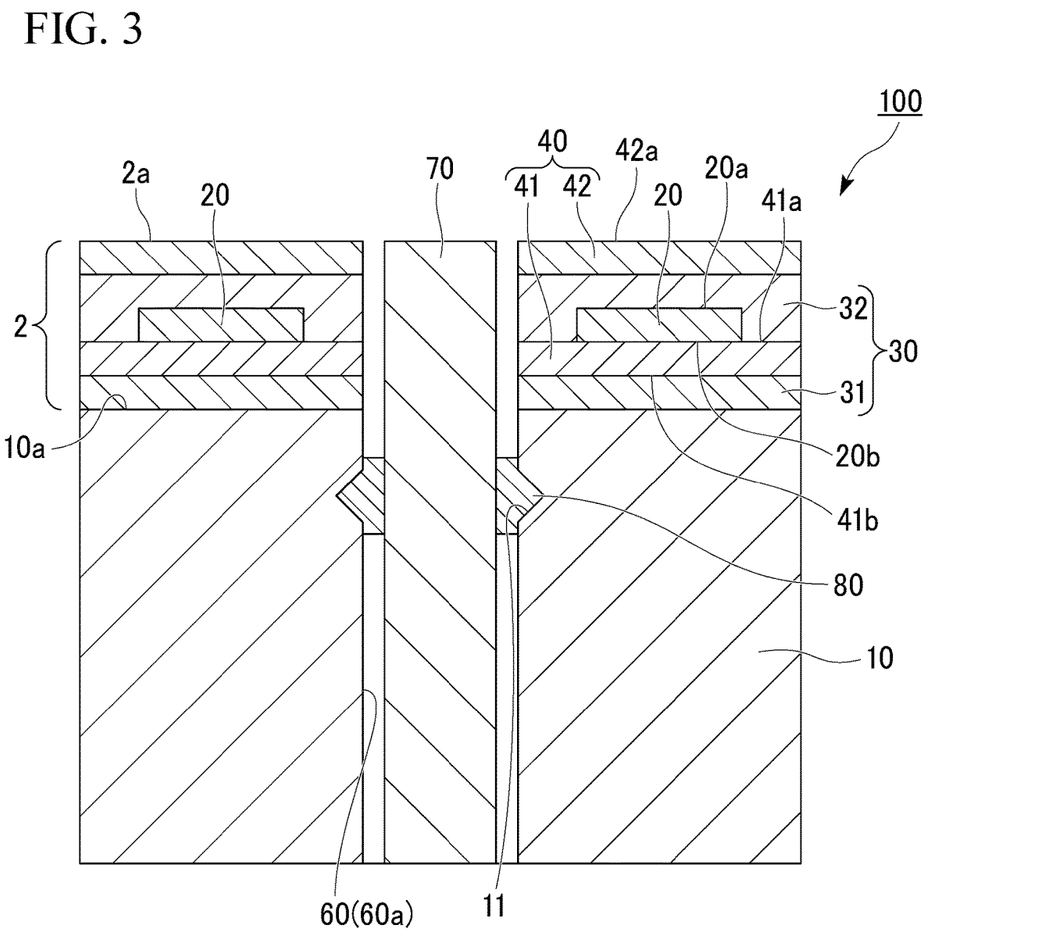
FIG. 3 shows a second embodiment of the schematic configuration of the electrostatic chuck device according to the present invention, being an enlarged view of the region α shown in FIG. 1.

FIG. 3 shows a second embodiment of the schematic configuration of the electrostatic chuck device according to the present invention, being an enlarged view of the region α shown in FIG. 1. In FIG. 3, the same constitutions as those of the electrostatic chuck device of the first embodiment shown in FIG. 2 are designated by the same reference numerals, with duplicate descriptions being omitted.

The electrostatic chuck device 100 of the present embodiment is different from the electrostatic chuck device 1 of the first embodiment described above as follows. Only in the upper portion of the substrate 10 in the thickness direction, a concave portion 11 having a triangular cross-sectional shape in the thickness direction of the substrate 10 is formed on the inner side surface 60a of the through-hole 60. The concave portion 11 is filled with a joining means 80 made of an adhesive, and the sleeve 70 is joined to the through-hole 60 via the joining means 80.

The cross-sectional shape of the concave portion 11 is not limited to the aforementioned triangular shape. Examples of the cross-sectional shape of the concave portion 11 in the thickness direction of the substrate 10 include an arc shape and a rectangular shape.

According to the electrostatic chuck device 100 of the present embodiment, since the means (concave portion 11 and joining means 80) for joining the sleeve to the through-hole are provided only at the upper portion of the substrate 10 in the thickness direction, it is possible to suppress the occurrence of cracking in the ceramic layer 50 (particularly the ceramic base layer 51) due to the thermal expansion of the substrate 10.

Third Embodiment

Figure 4:
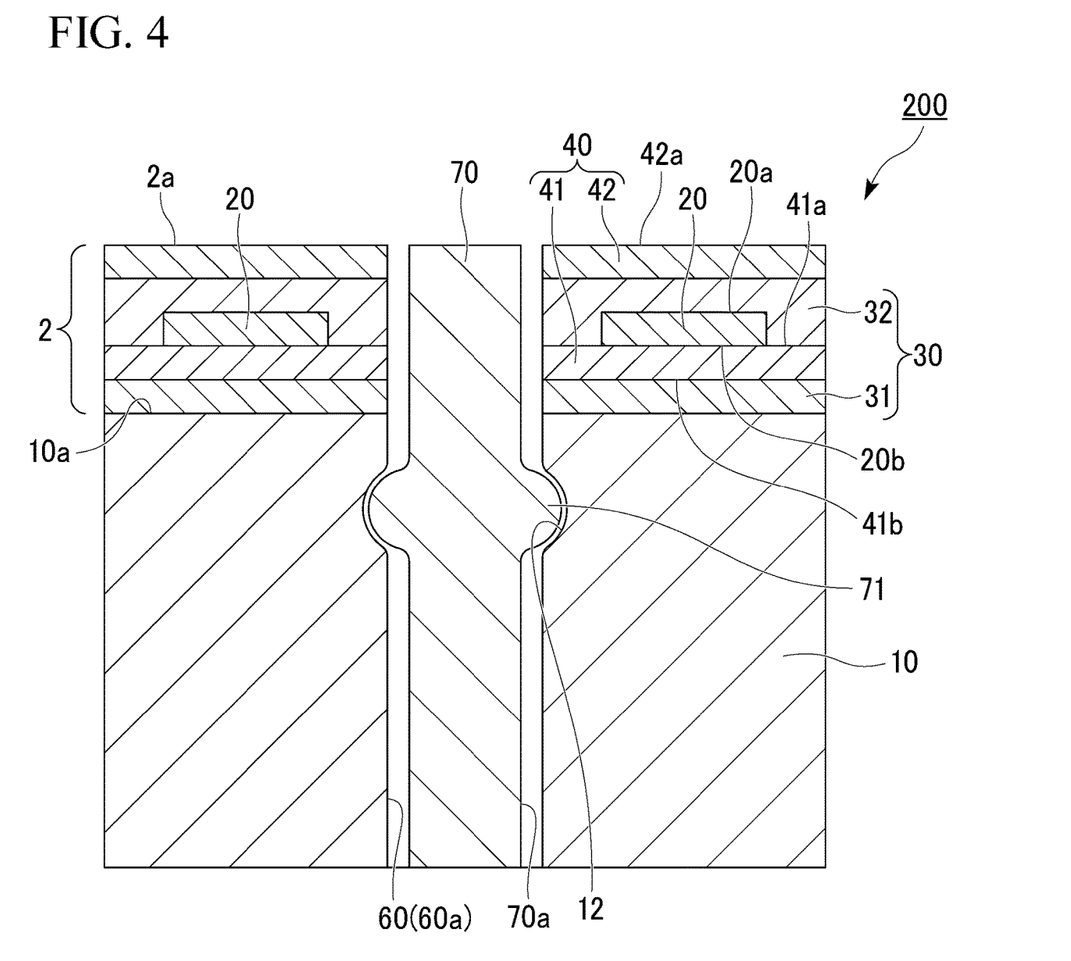
FIG. 4 shows a third embodiment of the schematic configuration of the electrostatic chuck device according to the present invention, being an enlarged view of the region α shown in FIG. 1.

FIG. 4 shows a third embodiment of the schematic configuration of the electrostatic chuck device according to the present invention, being an enlarged view of the region α shown in FIG. 1. In FIG. 4, the same components as those of the electrostatic chuck device of the first embodiment shown in FIG. 2 are designated by the same reference numerals, with duplicate descriptions being omitted.

The electrostatic chuck device 200 of the present embodiment differs from the electrostatic chuck device 1 of the first embodiment described above as follows. Only in the upper portion of the substrate 10 in the thickness direction, a concave portion 12 having an arcuate cross-sectional shape in the thickness direction of the substrate 10 is formed on the inner side surface 60a of the through-hole 60. A convex portion 71 provided so as to project outward from an outer side surface 70a of the sleeve 70 and whose cross-sectional shape in the longitudinal direction of the sleeve 70 (thickness direction of the substrate 10) is arcuate is engaged in the concave portion 12, with the sleeve 70 being joined to the through-hole 60 via the convex portion 71. That is, in the electrostatic chuck device 200 of the present embodiment, the convex portion 71 is a joining means for joining the sleeve 70 to the through-hole 60.

The cross-sectional shape of the concave portion 12 is not limited to the above arc shape. Examples of the cross-sectional shape of the concave portion 12 in the thickness direction of the substrate 10 include a triangular shape and a rectangular shape. Further, the cross-sectional shape of the convex portion 71 is not limited to the above-mentioned arc shape. Examples of the cross-sectional shape of the convex portion 71 in the longitudinal direction of the sleeve 70 include a triangular shape and a rectangular shape. Further, the cross-sectional shape of the concave portion 12 and the cross-sectional shape of the convex portion 71 do not have to be the same. As long as the convex portion 71 can engage the concave portion 12, the shapes thereof may be different.

According to the electrostatic chuck device 200 of the present embodiment, since the means for joining the sleeve 70 to the through-hole 60 (concave portion 12 and convex portion 71) are provided only at the upper portion of the substrate 10 in the thickness direction, it is possible to suppress the occurrence of cracking in the ceramic layer 50 (particularly the ceramic base layer 51) due to the thermal expansion of the substrate 10.

Fourth Embodiment

Figure 5:
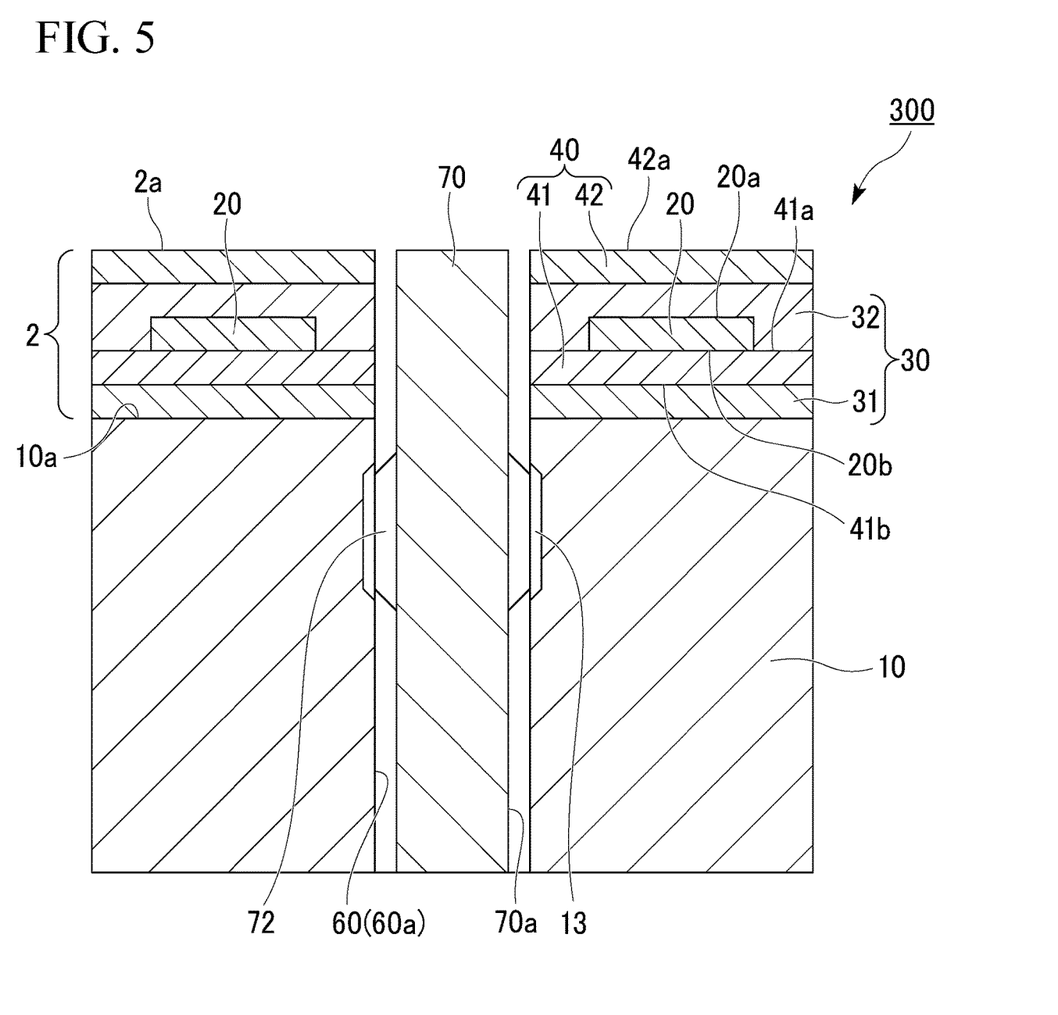
FIG. 5 shows a fourth embodiment of the schematic configuration of the electrostatic chuck device according to the present invention, being an enlarged view of the region α shown in FIG. 1.

FIG. 5 shows a fourth embodiment of the schematic configuration of the electrostatic chuck device according to the present invention, being an enlarged view of the region α shown in FIG. 1. In FIG. 5, the same components as those of the electrostatic chuck device of the first embodiment shown in FIG. 2 are designated by the same reference numerals, with duplicate descriptions being omitted.

The electrostatic chuck device 300 of the present embodiment differs from the electrostatic chuck device 1 of the first embodiment described above as follows. A female screw portion 13 is formed on the inner side surface 60*a* of the through-hole 60 only at the upper portion of the substrate 10 in the thickness direction. A male screw portion 72 provided so as to project outward from the outer side surface 70*a* of the sleeve 70 is screwed into the female screw portion 13, whereby the sleeve 70 is joined to the through-hole 60 via the female screw portion 13 and the male screw portion 72. That is, in the electrostatic chuck device 300 of the present embodiment, the female screw portion 13 and the male screw portion 72 are joining means for joining the sleeve 70 to the through-hole 60.

In the electrostatic chuck device 300 of the present embodiment, the case where the female screw portion 13 is formed on the inner side surface 60*a* of the through-hole 60 and the male screw portion 72 is formed on the outer side surface 70*a* of the sleeve 70 is illustrated. The electrostatic chuck device of the present invention is not limited thereto. In the electrostatic chuck device of the present invention, the male screw portion may be formed on the inner side surface of the through-hole, and the female screw portion may be formed on the outer side surface of the sleeve.

According to the electrostatic chuck device 300 of the present embodiment, since the means (female screw portion 13 and male screw portion 72) for joining the sleeve 70 to the through-hole 60 are provided only at the upper portion of the substrate 10 in the thickness direction, it is possible to suppress the occurrence of cracking in the ceramic layer 50 (particularly the ceramic base layer 51) due to the thermal expansion of the substrate 10.

Fifth Embodiment

Figure 6:
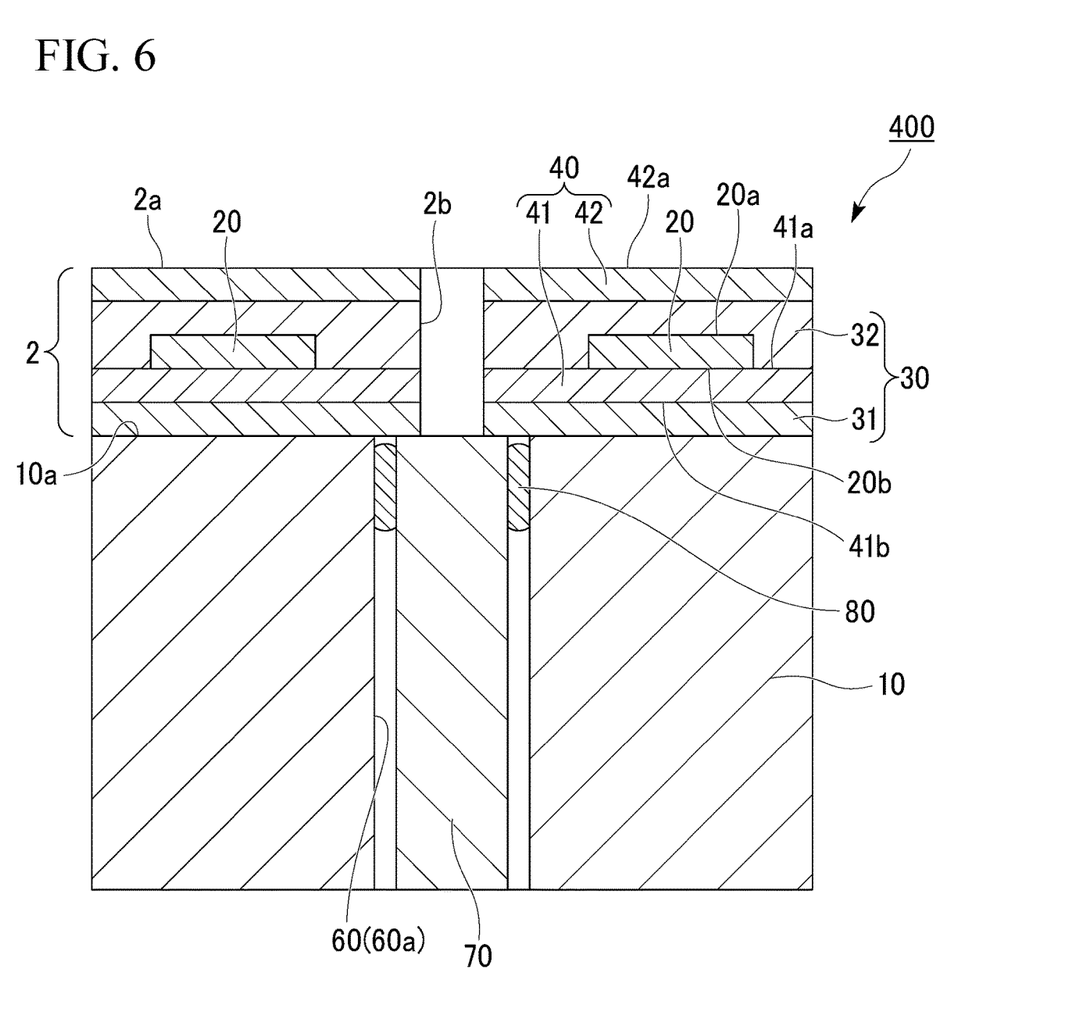
FIG. 6 shows a fifth embodiment of the schematic configuration of the electrostatic chuck device according to the present invention, being an enlarged view of the region α shown in FIG. 1.

FIG. 6 shows a fifth embodiment of the schematic configuration of the electrostatic chuck device according to the present invention, being an enlarged view of the region α shown in FIG. 1. In FIG. 6, the same components as those of the electrostatic chuck device of the first embodiment shown in FIG. 2 are designated by the same reference numerals, with duplicate descriptions being omitted.

The electrostatic chuck device 400 of the present embodiment differs from the electrostatic chuck device 1 of the first embodiment described above as follows. The through-hole 60 is not formed in the laminated body 2 formed on the upper portion of the substrate 10 in the thickness direction, and the tip of the sleeve 70 is fixed up to the first adhesive layer 31. A through-hole 2*b* having a smaller diameter than that of the through-hole 60 is formed in the laminated body 2, penetrating in the thickness direction.

Also in the electrostatic chuck device 400 of the present embodiment, the sleeve 70 inserted into the through-hole 60 is joined to the through-hole 60 via the joining means 80 only at the upper portion of the substrate 10 in the thickness direction. Accordingly, when the heat generated when forming the ceramic layer 50 is transferred to the electrostatic chuck device 400, the substrate 10 can extend to the lower side in the thickness direction thereof. For that reason, it is possible to prevent the ceramic layer 50 (particularly the ceramic base layer 51) from being cracked due to the thermal expansion of the substrate 10.

Further, in the electrostatic chuck device 400 of the present embodiment, when the through-hole 60 is a hole for inserting an HV pin (DC voltage pin) for applying a voltage to the internal electrodes, by providing the through-hole 60 in the first adhesive layer 31 and the first insulating organic film 41 without forming the through-hole 2*b* having a diameter smaller than the through-hole 60, the HV pin may be passed through the inner diameter of the sleeve 70 joined to the inside of the through-hole 60 so that the HV pin and the internal electrodes 20 come into contact with each other.

[Manufacturing Method of Electrostatic Chuck]

The manufacturing method of the electrostatic chuck device 1 of the present embodiment will be described with reference to FIG. 1.

A metal such as copper is vapor-deposited on the surface 41*a* of the first insulating organic film 41 (the upper surface of the first insulating organic film 41 in the thickness direction) to form a thin metal film. After that, etching is performed to pattern the metal thin film into a predetermined shape to form the internal electrodes 20.

Next, the second insulating organic film 42 is attached to the upper surface 20*a* of the internal electrodes 20 via the second adhesive layer 32 to obtain the laminated body 2.

Next, a laser beam is irradiated from the surface of the laminated body 2 to form a hole in the laminated body 2 aligned with the through-hole 60 in the substrate 10.

On the other hand, after forming the through-hole 60 in the substrate 10 by a drill or the like, the sleeve 70 is inserted into the through-hole 60, and the sleeve 70 is joined to the through-hole 60 via the joining means 80 provided only at the upper portion of the substrate 10 in the thickness direction.

Next, the laminated body 2 is joined to the surface 10*a* of the substrate 10 via the first adhesive layer 31 so that the lower surface 41*b* of the first insulating organic film 41 in the laminated body 2 having a hole is on the surface 10*a* side of the substrate 10, and the hole of the laminated body 2 and the through-hole 60 of the substrate 10 match.

Next, the ceramic base layer 51 is formed so as to cover the entire outer surface of the laminated body 2.

Examples of the method for forming the ceramic base layer 51 include a method in which a slurry containing a material constituting the ceramic base layer 51 is applied to the entire outer surface of the laminated body 2 and sintered to form the ceramic base layer 51, and a method of forming the ceramic base layer 51 by spraying the material constituting the ceramic base layer 51 onto the entire outer surface of the laminated body 2.

Here, spraying denotes a method of forming a film by heating and melting a material to be a coating film (ceramic base layer 51 in the present embodiment) and then emitting the material onto an object to be treated using compressed gas.

Next, the ceramic surface layer 52 is formed on the upper surface 51*a* of the ceramic base layer 51. Examples of methods of forming the ceramic surface layer 52 include a method of forming the ceramic surface layer 52 by spraying the material constituting the ceramic surface layer 52 onto the upper surface 51*a* of the ceramic base layer 51 after masking the upper surface 51*a* of the ceramic base layer 51 with a predetermined shape, and a method in which a material constituting the ceramic surface layer 52 is sprayed onto the entire upper surface 51*a* of the ceramic base layer 51 to form the ceramic surface layer 52, after which the ceramic surface layer 52 is scraped by a blast treatment to form the ceramic surface layer 52 into an irregular shape.

By the aforementioned steps, the electrostatic chuck device 1 of the present embodiment can be manufactured.

INDUSTRIAL APPLICABILITY

According to the electrostatic chuck device of the present invention, a substrate has a through-hole provided so as to penetrate in the thickness direction, a sleeve is inserted into the through-hole, and since the sleeve is joined to the through-hole only at the upper part in the thickness direction of the substrate via the joining means, when the heat generated when forming the ceramic layer is transferred to the electrostatic chuck device, the substrate can extend to the lower side in the thickness direction thereof. Accordingly, it is possible to prevent the occurrence of cracking in the ceramic layer due to the thermal expansion of the substrate. That is, it is possible to suppress the occurrence of cracking in the ceramic layer caused by a difference in thermal expansion between the substrate and the sleeve.

DESCRIPTION OF THE REFERENCE SYMBOLS

1, 100, 200, 300, 400: Electrostatic chuck device
2: Laminated body
10: Substrate
11, 12: Concave portion
13: Female screw portion
20: Internal electrode
30: Adhesive layer
31: First adhesive layer
32: Second adhesive layer
40: Insulating organic film
41: First insulating organic film
42: Second insulating organic film
50: Ceramic layer
51: Ceramic base layer
52: Ceramic surface layer
60: Through-hole
70: Sleeve
71: Convex portion
72: Male screw portion
80: Joining means

The invention claimed is:

1. An electrostatic chuck device comprising:
a substrate comprising:
  a through-hole provided so as to pass through in a thickness direction of the substrate, the through-hole having a concave portion provided on an inner wall of the hole within 50% of the thickness of the substrate from a surface of the substrate,
  adhesive within the concave portion of the through-hole, and having a total length amount to 5% to 30% of the thickness of the substrate, and
  a sleeve, formed from an insulating material, inserted into the through-hole and joined to the through-hole via the adhesive;
a laminated body that is laminated on the substrate and that includes at least an internal electrode; and
a ceramic layer that is laminated on the upper surface of the laminated body in the thickness direction.

2. The electrostatic chuck device according to claim 1, wherein the ceramic layer comprises a base layer and a surface layer formed on the upper surface of the base layer and having irregularities.

3. The electrostatic chuck device according to claim 2, wherein the laminated body comprises at least an insulating organic film provided on both sides of the internal electrode in the thickness direction.

4. The electrostatic chuck device according to claim 1, wherein the laminated body comprises at least an insulating organic film provided on both sides of the internal electrode in the thickness direction.

\* \* \* \* \*